United States Patent
Chang

(10) Patent No.: US 6,188,626 B1
(45) Date of Patent: Feb. 13, 2001

(54) METHOD OF REFRESHING DYNAMIC RANDOM ACCESS MEMORY

(75) Inventor: Nai-Shung Chang, Yung-Ho (TW)

(73) Assignee: VIA Technologies, Inc., Taipei Hsien (TW)

( * ) Notice: Under 35 U.S.C. 154(b), the term of this patent shall be extended for 0 days.

(21) Appl. No.: 09/268,920

(22) Filed: Mar. 16, 1999

(30) Foreign Application Priority Data

Aug. 29, 1998 (TW) .................................. 87114353

(51) Int. Cl.$^7$ ..................................... G11C 7/00

(52) U.S. Cl. ..................... 365/222; 365/189.01

(58) Field of Search ................. 365/222, 189.01

(56) References Cited

U.S. PATENT DOCUMENTS 5,453,959 * 9/1995 Sakuta et al. ..................... 365/222

* cited by examiner

Primary Examiner—David Nelms
Assistant Examiner—M. Tran
(74) Attorney, Agent, or Firm—J.C. Patents; Jiawei Huang

(57) ABSTRACT

A method of refreshing DRAM. The method of the invention utilizes the time, in which CPU is executing a cache hit cycle, an input/output cycle, an interrupt acknowledge cycle or an idle cycle, to perform a least one refresh cycle for refreshing DRAM. It uses the time, in which CPU does not access DRAM, to perform the refresh cycle. Besides, it needs to insert the rest of the refresh cycles, which are required to be accomplished during a fixed time period, to replace any operational cycle of DRAM before the end of the fixed time period comes.

10 Claims, 3 Drawing Sheets

METHOD OF REFRESHING DYNAMIC RANDOM ACCESS MEMORY

CROSS-REFERENCE TO RELATED APPLICATION

This application claims the priority benefit of Taiwan application serial no. 87114353, filed Aug. 29, 1998, the full disclosure of which is incorporated herein by reference

BACKGROUND OF THE INVENTION

1. Field of Invention

The present invention relates to a method of controlling dynamic random access memory (DRAM). More particularly, the present invention relates to a method of refreshing DRAM for increasing operation efficiency of a computer system.

2. Description of Related Art

Typically, DRAM is used to serve as main memory of a computer, And, the memory cells of DRAM have a plurality of small capacitors in its inner. While data are written into DRAM in a writing cycle, the capacitors are charged, and while data are read from memory cells in following reading cycle, the amount of charges stored in the capacitors indicate the logic states of the memory cells. DRAM suffers current leakage of capacitors since each DRAM memory cell composes of a capacitor. Therefore, typical DRAM needs so-called refresh cycles, and DRAM can update its inner data during the refresh cycles.

According to the memory storage capacity, various DRAM are refreshed by operating various refresh cycles, for example:

4M×4→4096 cycles at 64 ms; and

1M×4→1024 cycles it 16 ms.

That is various DRAM perform different refresh cycles if the number of their memory row addresses are different. For 4M×4 DRAM, it is usually required to perform one DRAM refreshing during (64 ms/4096) time period.

The conventional methods of refreshing DRAM are described in the following.

A conventional method of refreshing DRAM is provided in early computer system. When DRAM is required to perform DRAM refreshing, the operation of a central processing unit (CPU) of a computer is suspended, and the operation of CPU is not rightened until the DRAM refreshing is accomplished by a DRAM controller. In this manner, the utilization efficiency of the system decreases, such as about 3% to 5%, since it needs to stop CPU for a long time period to perform DRAM refreshing, in order to avoid transferred data loss between DRAM and CPU.

Till the 386-computer are, the refresh cycle of DRAM is hidden into the DRAM cycle, such as a Hidden Refresh method, which is described by Frenkil et al in the U.S. Pat. No. 5,193,072. In Hidden Refresh method, a register is used to keep a record for performing one refresh cycle every specific CPU cycles, and the register is set up by a basic input output system (BIOS). When the time for refreshing DRAM starts, DRAM controller suspends current work of DRAM and inserts one refresh cycle into normal clock cycles, hereby DRAM is refreshed by DRAM controller.

Referring to FIG. 1, which is a flow chart illustrating a conventional Hidden Refresh method.

Step 100: when a computer system is turn on, BIOS installs a set of default settings into a register, to define a predetermined time period to perform one refresh cycle, for instance considering 4M×4 DRAM. DRAM is required to perform one refresh cycle during (64 ms/4096) time period.

Step 110: judging whether the end of a predetermined time period has come. Returning to the step 100 if the end of the predetermined time period has not come, and executing a step 120 if the end of the predetermined time period has come.

Step 120: judging whether CPU is performing a DRAM cycle. Namely judging whether CPU is using,) DRAM. Executing a step 130 if CPU is not performing a DRAM cycle, and executing a step 140 if CPU is performing a DRAM cycle.

Step 130: performing one refresh cycle if CPU is not performing a DRAM cycle.

Step 140: if CPU is performing a DRAM cycle, the DRAM cycle is suspended, and insert one refresh cycle to replace the DRAM cycle. Meanwhile, current request for accessing DRAM must be delay so DRAM is performed to refresh.

The Hidden Refresh method is better than the first. Because DRAM controller just inserts one refresh cycle before the predetermined time period ends, CPU is not occupied if CPU is processing the other work, such as calculation, during the refresh cycle. Accordingly CPU of a computer system with DRAM performing Hidden Refresh method operates more efficiently.

However, for current DRAM, the refresh cycle must be performed every (64 ms/4096) in the Hidden Refresh methods for current synchronous dynamic access random (SDRM). the refresh cycle is performed for 3 to 5 clock cycles: for extend data out DRAM (EDO DRAM), it requires 60 to 90 nanoseconds to perform one refresh cycle; and all these refresh cycles are regularly arranged in the DRAM cycles.

In present computer system, it requires more DRAM cycles to operate specific function, such as AGP technology, in which a part of DRAM is used to serve as graphic memory. The system efficiency depends on the efficiency of utilizing DRAM, the refresh cycle of DRAM has significant influence of DRAM utilization efficiency, thus it is effective for improving the system efficiency if avoiding the refresh cycles occupy the DRAM cycles.

In light of the foregoing, there is a need to provide a novel method of refreshing DRAM for preventing most of the refresh cycles from occupying the DRAM cycles.

SUMMARY OF THE INVENTION

Accordingly, the present invention is to provide a novel smart method of refreshing DRAM, for preventing most of the refresh cycles from occupying the DRAM cycles and improving the system efficiency.

To achieve these and other advantages and in accordance with the purpose of the invention, as embodied and broadly described herein, the invention provides a method of refreshing DRAM, wherein a plurality of refresh cycles, which are performed to refresh DRAM, are accomplished every fixed time period. The method of refreshing DRAM comprises the steps of: (a) judging whether the time remaining in the fixed time period is longer than the time for finishing the rest of the refresh cycles; (b) performing the rest of the refresh cycles, if the time remaining in the fixed time period is not longer than the time for finishing, the rest of the refresh cycles; otherwise, judging whether a specific cycle, in which DRAM is idle, is occurring; and (c) performing a least one refresh cycles if the specific cycle is occurring, then returning to the step of judging whether the time remaining in the fixed time period is longer than the time for finishing the rest of the refresh cycles; otherwise, returning, to the step of judging whether the time remaining in the fixed time period is longer than the time for finishing the rest of the refresh cycles.

To achieve these and other advantages and in accordance with the purpose of the invention, as embodied and broadly described herein, the invention provides another method of refreshing DRAM, wherein one refresh cycle, which is performed to refresh DRAM, is accomplished every fixed time period. The method of refreshing DRAM comprises the steps of: (a) judging, whether a specific cycle, in which DRAM is idle, is occurring; (b) performing one refresh cycle if the specific cycle is occurring; (c) judging whether the end of the fixed time period has come; (d) performing one refresh cycle if the end of the fixed time period has come and the specific cycle has not occur ever; and (e) returning to the step of judging whether the specific cycle is occurring if the end of the fixed time period has not come and the specific cycle has not occur ever.

To achieve these and other advantages and in accordance with the purpose of the invention, as embodied and broadly described herein, the invention provides a method of refreshing DRAM, wherein one refresh cycle for refreshing DRAM is accomplished every fixed time period a predetermined time is provided, that is before the end of the fixed time period a time segment, which is enough to perform one refresh cycle. The method of refreshing DRAM comprises the steps of: (a) judging whether a specific cycle, in which DRAM is idle, is occurring; (b) performing one refresh cycle if the specific cycle is occurring; (c) judging whether the predetermined time has come; (d) performing one refresh cycle if the predetermined time has come and the specific cycle has not occur ever; and (e) returning to the step of judging whether the specific cycle is occurring if the predetermined time has not come and the specific cycle has not occur ever.

Furthermore, the specific cycle above described is selected from a group of a cache hit cycle, an input/output cycle, an interrupt acknowledge cycle and an idle cycle.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
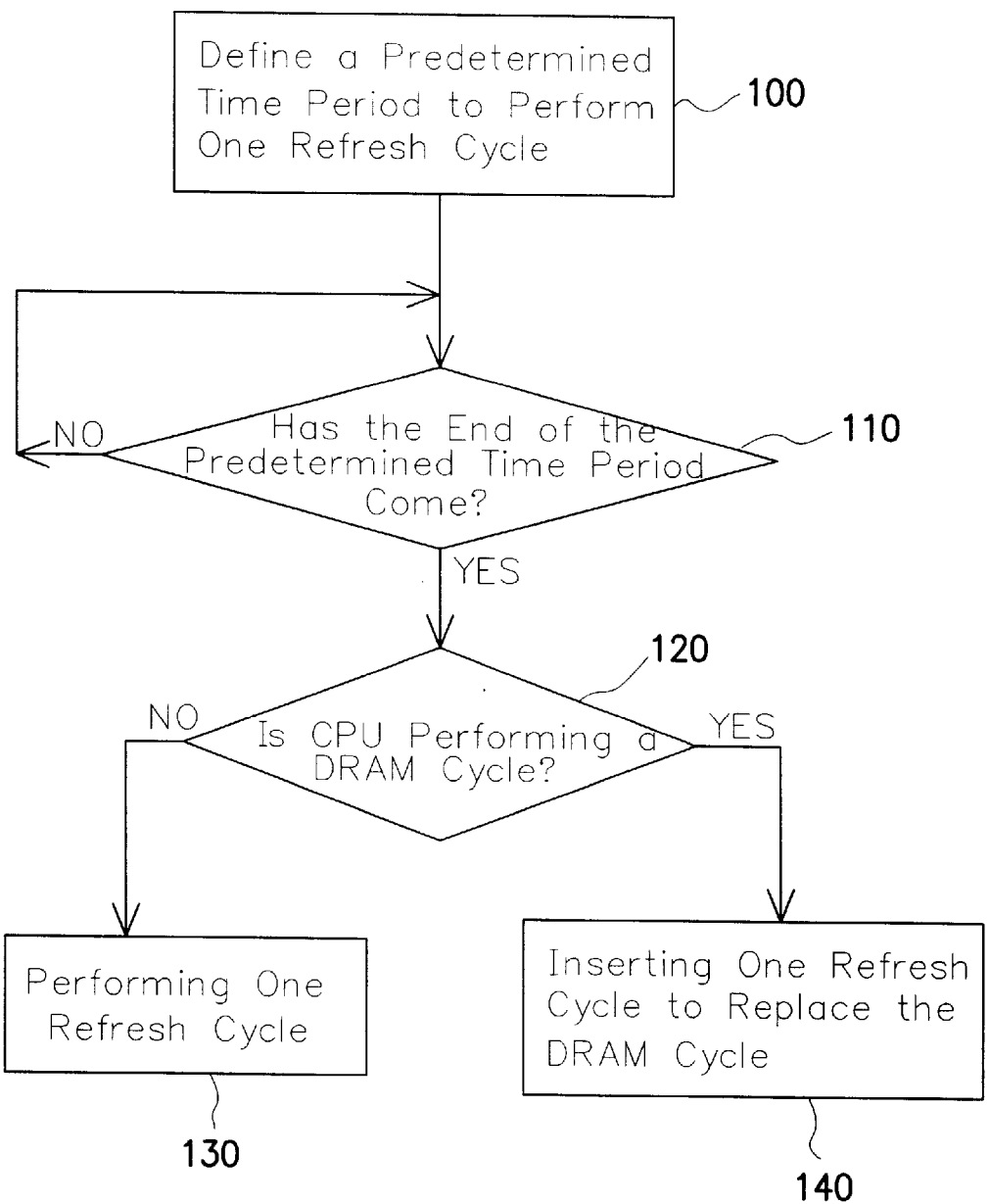
FIG. 1 is a flow chart showing the processing steps of a conventional Hidden Refresh method.

Reference will now be made in detail to the present preferred embodiments of the invention, examples of which are illustrated in the accompanying drawings. Wherever possible, the same reference numbers are used in the drawings and the description to refer to the same or like parts.

For present personal computer (PC), there are lots of specific operational cycles therein, such as input/output (I/O) reading cycle, I/O writing cycle and interrupt acknowledge cycle etc. Because P54C type PC has L2 cache, which is outside CPU of the PC, there are not only above specific operational cycles but also cache hit reading cycle and cache hit writing cycle.

Compare to the conventional method, which performing one refresh cycle during (64 mini-seconds/4096) time period, the feature of the method for refreshing DRAM according to first preferred embodiment of this invention is that, performing 4096 times refresh cycles before 64 mini-seconds time period ends. Firstly, calculating how much time CPU spends to execute an I/O reading cycle, an I/O writing cycle, an interrupt acknowledge cycle, a cache hit reading cycle and a cache writing cycle. Then, before 64 mini-seconds time period ends, verifying how many times of the rest of refresh cycles, which are required to finished every 64 mini-seconds time period, are not accomplished, and finishing the rest of refresh cycles.

Figure 2:
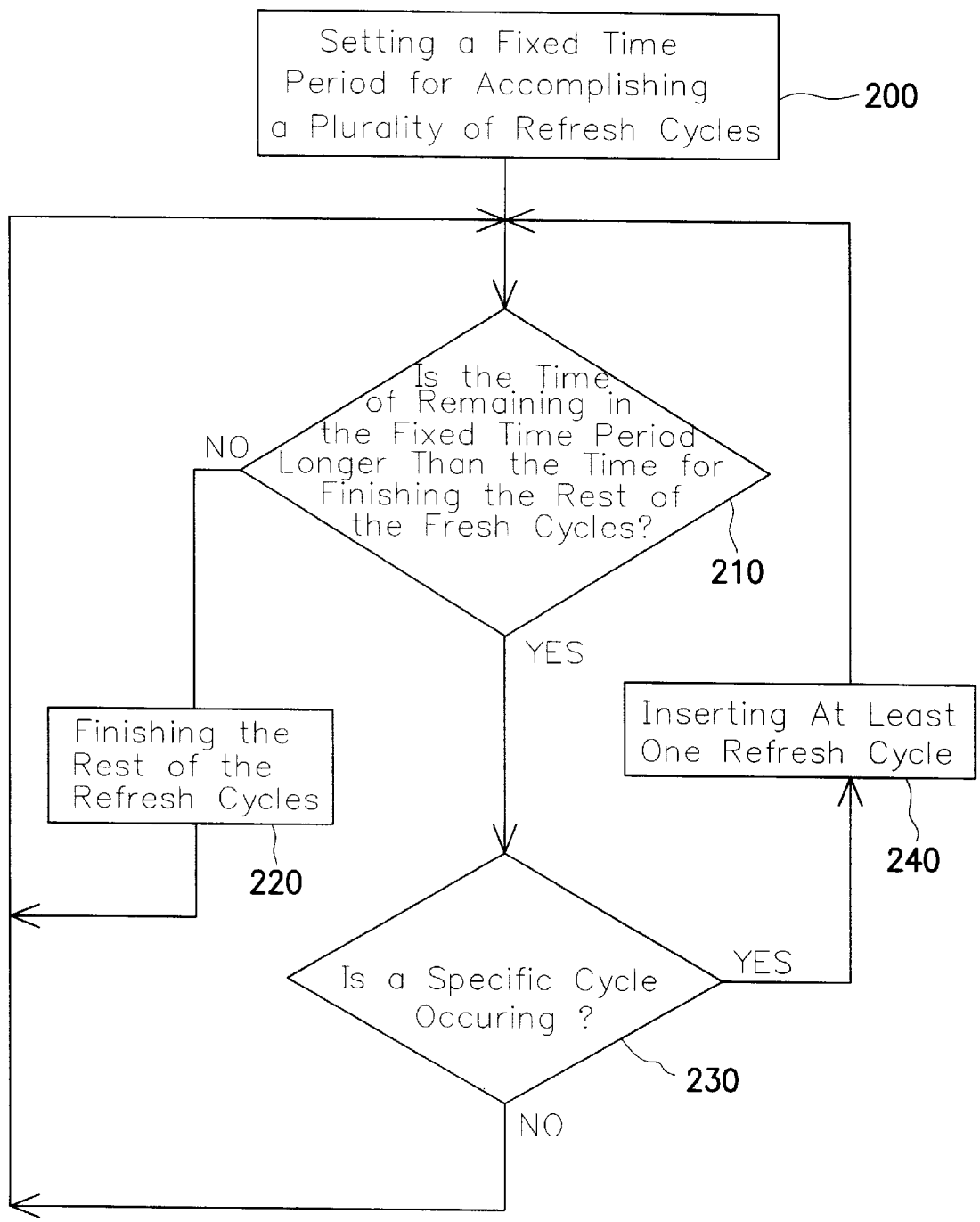
FIG. 2 is a flow chart showing the processing steps of a method of refreshing DRAM according to the first preferred embodiment of this invention.

Referring to FIG. 2 for illustrating, the method for refreshing DRAM according to the first preferred embodiment of this invention.

Step 200: in the beginning, the system sets a fixed time period for accomplishing a plurality of DRAM refresh cycles. e.g. for 4M×4 DRAM, 4096 refresh cycles must be finished during 64 mini-seconds the period. After that, executing a step 210.

Step 210: judging whether the time remaining in the fixed time period is longer than the time for finishing the rest of the refresh cycles. That is judging whether before the fixed time period ends, the time remaining in the fixed time period is enough to finish the rest of DRAM refresh cycles. If the time remaining in the fixed time period is not longer than the time for finishing the rest of the refresh cycles, then executing a step 220. If the time remaining in the fixed time period is longer than the time for finishing the rest of the refresh cycles, then returning to the step 210.

Step 220: finishing the rest of the refresh cycles when the time remaining in the fixed time period is not longer than the time for finishing all rest of the refresh cycles. Thus the refresh cycles are accomplished every the fixed time period.

Step 230: judging whether a specific cycle, in which DRAM is idle, is occurring when the time remaining in the fixed time period is longer than the time for finishing all rest of the refresh cycles. The specific cycle is selected from a group of a cache hit cycle, an input/output (I/O) cycle, an interrupt acknowledge cycle and an idle cycle. Namely the step 230 is used to judge whether CPU is executing the cache hit cycle, the input/output (I/O) cycle, the interrupt acknowledge cycle or the idle cycle. If CPU is not performing the above specific cycles, then returning to the step 210; otherwise, executing a step 240.

Step 240: inserting, at least one refresh cycle for refreshing DRAM when CPU is performing the above specific cycles, and then returning to the step 210.

In the first preferred embodiment of this invention, inserting at least one refresh cycle for refreshing DRAM as long as CPU is performing the above specific cycles during 64 mini-seconds time period, and finishing the all rest of the refresh cycles before the 64 mini-seconds time period ends. Because the refreshing method according to the first preferred embodiment of this invention utilizes the time, in which does not access DRAM, to refresh DRAM, it effectively improves the operation efficiency of the computer system.

According to the second preferred embodiment of this invention, a method of refreshing DRAM performs one refresh cycle every fixed time period, e.g. (64 ms/4096) time period. Besides, in comparison with the conventional Hidden Refresh method, it just performs one refresh cycle during the fixed time period and is not required to refresh DRAM on the beginning or end of the fixed time period. While CPU executes any specific cycle, which is selected from a group of a cache hit cycle, an I/O cycle, an interrupt acknowledge cycle and an idle cycle, meanwhile the refresh cycle is performed to refresh DRAM and the refresh cycle just is performed once the fixed time period. Otherwise, if CPU does not execute any specific cycle during the fixed time period, the refresh cycle is required to be performed when/before the end of the fixed time period comes.

Figure 3:
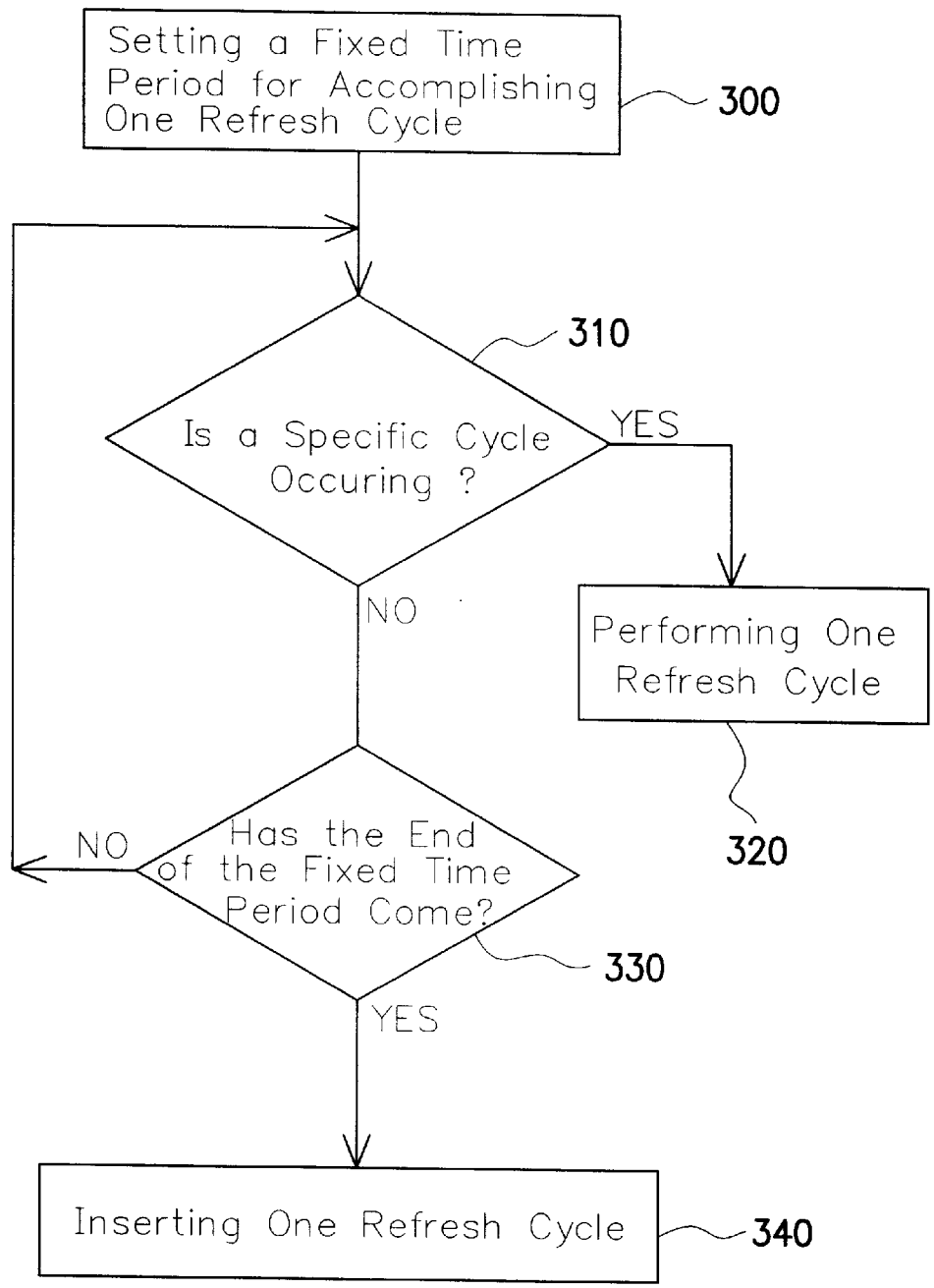
FIG. 3 is a flow chart showing the processing steps of a method of refreshing DRAM according to the second preferred embodiment of this invention.

Referring to FIG. 3, which is a flow chart illustrating a novel method of refreshing DRAM according to the second preferred embodiment of this invention.

Step 300: in the beginning, the system sets a fixed time period for accomplishing one DRAM refresh cycles, e.g. for 4M×4 DRAM, one refresh cycle must be finished during (64 ms/4096) time period. After that, executing a step 310.

Step 310: judging whether a specific cycle, in which DRAM is idle, is occurring. The specific cycle is selected from a group of a cache hit cycle, an input/output cycle, an interrupt acknowledge cycle and an idle cycle. Namely the step 310 is used to judge whether CPU is executing the cache hit cycle, the I/O cycle, the interrupt acknowledge cycle or the idle cycle. If CPU is not performing any above specific cycles, then executing a step 330: otherwise, executing a step 320.

Step 320: performing one refresh cycle when CPU is executing the specific cycle, thereby accomplishing the DRAM refreshing during the fixed time period.

Step 330: judging whether the end of the fixed time period has come if CPU does not ever execute the specific cycle during the fixed time period. If the end of the fixed time period has not come, then returning to the step 310: otherwise, executing a step 340.

Step 340: inserting one refresh cycle for refreshing DRAM. One refresh cycle is required to be inserted for refreshing DRAM if the end of the fixed time period has come, thereby accomplishing the DRAM refreshing during the fixed time period. The step 340, inserting one refresh cycle for refreshing DRAM, is similar to the step 120 (shown FIG. 1) of Hidden Refresh method, that is the step 340 is equivalent to the combination of the steps 120, 130 and 140.

Hereinafter, the alternative steps 330 and 340 are described. Step 330: judging whether a predetermined time, that is before the end of the fixed time period a time segment, which is enough to perform one refresh cycle, has come. Step 340: inserting one refresh cycle for refreshing DRAM. One refresh cycle is required to be inserted for refreshing DRAM if the predetermined time has come, thereby accomplishing all of the refresh cycles during the fixed time period. Likewise, the step 340, inserting one refresh cycle for refreshing DRAM, is similar to the step 120 (shown FIG. 1) of Hidden Refresh method, that is the step 340 is equivalent to the combination of the steps 120, 130 and 140.

In the second preferred embodiment of this invention, performing one refresh cycle as long as CPU is performing any specific cycle during the (64 ms/4096) time period, and after performing one refresh cycle, it is not required to execute any other refresh cycle at that time period. Moreover, when the end of the fixed time period has come and CPU has not ever execute any specific cycle, then similarly with Hidden Refresh method inserting one refresh cycle for refreshing DRAM. Because the method according to the second preferred embodiment of this invention can effectively utilize the time, at which CPU does not access DRAM, to refresh DRAM, the efficiency of computer system can increase significantly.

It will be apparent to those skilled in the art that various modifications and variations can be made to the structure of the present invention without departing from the scope or spirit of the invention. In view of the foregoing, it is intended that the is present invention cover modifications and variations of this invention provided they fall within the scope of the following claims and their equivalents.

What is claimed is:

1. A method of refreshing DRAM initiated by a processor, wherein a plurality of refresh cycles, which are performed to refresh DRAM, are accomplished every fixed time period, comprising the steps of:

judging whether the time remaining in the fixed time period is longer than the time for finishing the rest of the refresh cycles by the processor;

performing the rest of the refresh cycles, if the time remaining in the fixed time period is not longer than the time for finishing the rest of the refresh cycles; otherwise, judging whether a specific cycle, in which DRAM is idle, is occurring; and performing at least one refresh cycles initiated by the processor if the specific cycle is occurring, then returning to the step of judging whether the time remaining in the fixed time period is longer than the time for finishing the rest of the refresh cycles; otherwise, returning to the step of judging whether the time remaining in the fixed time period is longer than the time for finishing the rest of the refresh cycles.

2. The method of refreshing DRAM as claim 1, wherein performing a plurality of refresh cycles while the specific cycle is occurring.

3. The method of refreshing DRAM as claim 1, wherein the specific cycle is selected from a group of a cache hit cycle, an input/output cycle, an interrupt acknowledge cycle and an idle cycle.

4. The method of refreshing DRAM as claim 1, wherein the fixed time period is 64 milliseconds, and 4096 refresh cycles are accomplished every fixed time period.

5. A method of refreshing DRAM by a processor, wherein one refresh cycle, which is performed to refresh DRAM, is accomplished every fixed time period, comprising the steps of:

judging whether a specific cycle, in which DRAM is idle, is occurring;

performing one refresh cycle if the specific cycle is occurring;

judging whether the end of the fixed time period has come;

performing one refresh cycle if the end of the fixed time period has come; and returning to the step of judging whether the specific cycle is occurring if the end of the fixed time period does has not come.

6. The method of refreshing DRAM as claim 5 wherein the specific cycle is selected from a group of a cache hit cycle, an input/output cycle, an interrupt acknowledge cycle and an idle cycle.

7. The method of refreshing DRAM as claim 5, wherein the fixed time period is (64/4096) milliseconds.

8. A method of refreshing DRAM, wherein one refresh cycle for refreshing DRAM is accomplished every fixed time period, a predetermined time is provided, that is before the end of the fixed time period a time segment, which is enough to perform one refresh cycle, comprising the steps of:

judging whether a specific cycle, in which DRAM is idle, is occurring;

performing one refresh cycle if the specific cycle is occurring;

judging whether the predetermined time has come;

performing one refresh cycle if the predetermined time has come; and returning to the step of judging whether the specific cycle is occurring if the predetermined time has not come.

9. The method of refreshing DRAM as claim 8, wherein the specific cycle is selected from a group of a cache hit cycle, an input/output cycle, an interrupt acknowledge cycle and an idle cycle.

10. The method of refreshing DRAM as claim 8, wherein the fixed time period is (64/4096) milliseconds.

* * * * *